(12) United States Patent
Van Der Schaar et al.

(10) Patent No.: US 10,585,357 B2
(45) Date of Patent: Mar. 10, 2020

(54) ALTERNATIVE TARGET DESIGN FOR METROLOGY USING MODULATION TECHNIQUES

(71) Applicant: ASML NETHERLANDS B.V., Veldhoven (NL)

(72) Inventors: Maurits Van Der Schaar, Eindhoven (NL); Youping Zhang, Fremont, CA (US); Hua Xu, Fremont, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/063,190

(22) PCT Filed: Dec. 13, 2016

(86) PCT No.: PCT/EP2016/080742
§ 371 (c)(1),
(2) Date: Jun. 15, 2018

(87) PCT Pub. No.: WO2017/114652
PCT Pub. Date: Jul. 6, 2017

(65) Prior Publication Data
US 2018/0373168 A1    Dec. 27, 2018

Related U.S. Application Data

(60) Provisional application No. 62/387,571, filed on Dec. 28, 2015.

(51) Int. Cl.
*G01B 11/14* (2006.01)
*G03F 7/20* (2006.01)
*G03F 9/00* (2006.01)

(52) U.S. Cl.
CPC ...... *G03F 7/70633* (2013.01); *G03F 7/70683* (2013.01); *G03F 9/7076* (2013.01); *G03F 9/7088* (2013.01)

(58) Field of Classification Search
CPC ..... G01B 11/026; G01B 11/002; G01B 11/14; G01S 5/163; G01S 5/16
(Continued)

(56) References Cited

U.S. PATENT DOCUMENTS

| 7,671,990 B1 | 3/2010 | Adel et al. |
| 2002/0080365 A1 | 6/2002 | Monshouwer et al. |

(Continued)

FOREIGN PATENT DOCUMENTS

| EP | 1348149 B1 | 8/2005 |
| EP | 1674938 A1 | 6/2006 |

(Continued)

OTHER PUBLICATIONS

International Search Report dated Mar. 2, 2017 issued in corresponding International Application No. PCT/EP2016/080742.

*Primary Examiner* — Md M Rahman
(74) *Attorney, Agent, or Firm* — Pillsbury Winthrop Shaw Pittman, LLP

(57) ABSTRACT

A target structure, wherein the target structure is configured to be measured with a metrology tool that has a diffraction threshold; the target structure including: one or more patterns supported on a substrate, the one or more patterns being periodic with a first period in a first direction and periodic with a second period in a second direction, wherein the first direction and second direction are different and parallel to the substrate, and the first period is equal to or greater than the diffraction threshold and the second period is less than the diffraction threshold.

20 Claims, 12 Drawing Sheets

(58) Field of Classification Search
 USPC .......................................................... 356/614
 See application file for complete search history.

(56) References Cited

U.S. PATENT DOCUMENTS

| | | |
|---|---|---|
| 2006/0141374 A1 | 6/2006 | Van Bilsen |
| 2009/0153861 A1 | 6/2009 | Musa et al. |
| 2009/0310113 A1 | 12/2009 | Musa et al. |
| 2011/0019173 A1 | 1/2011 | Vladimirsky et al. |
| 2015/0293458 A1 | 10/2015 | Vanoppen et al. |

FOREIGN PATENT DOCUMENTS

| | | |
|---|---|---|
| EP | 2065920 A1 | 6/2009 |
| WO | 2014/082938 A1 | 6/2014 |

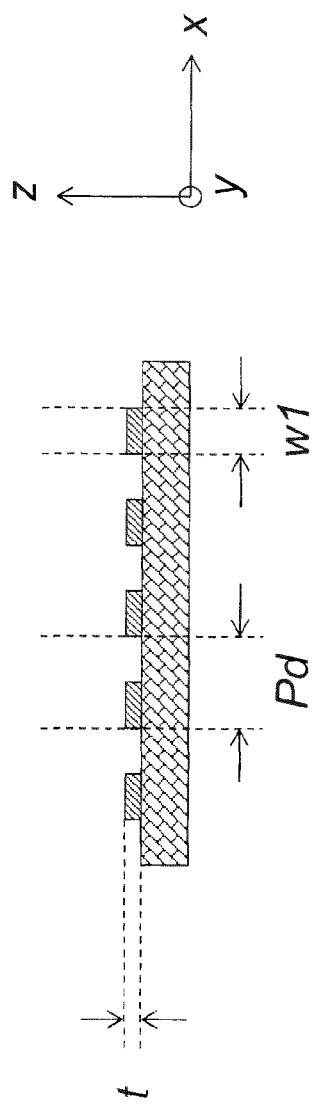
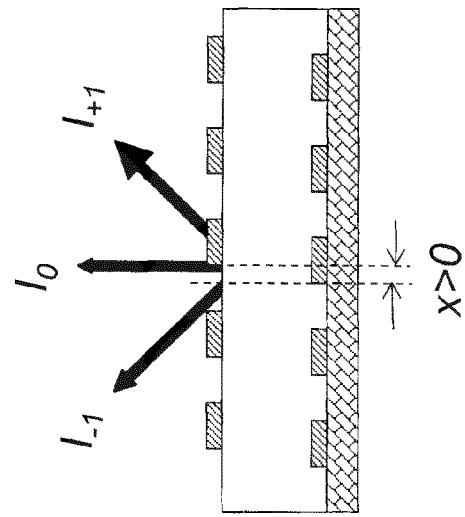
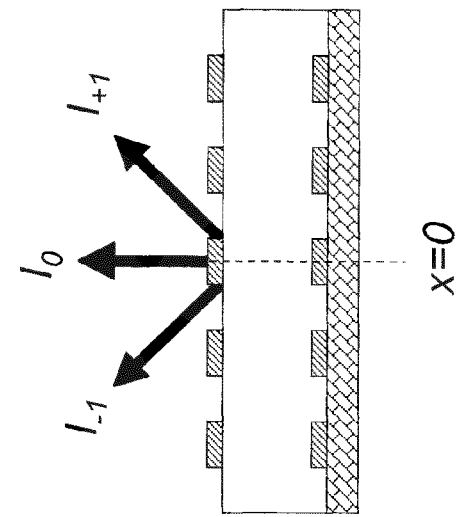
Figure 5A
Figure 5B
Figure 5C
Figure 5D

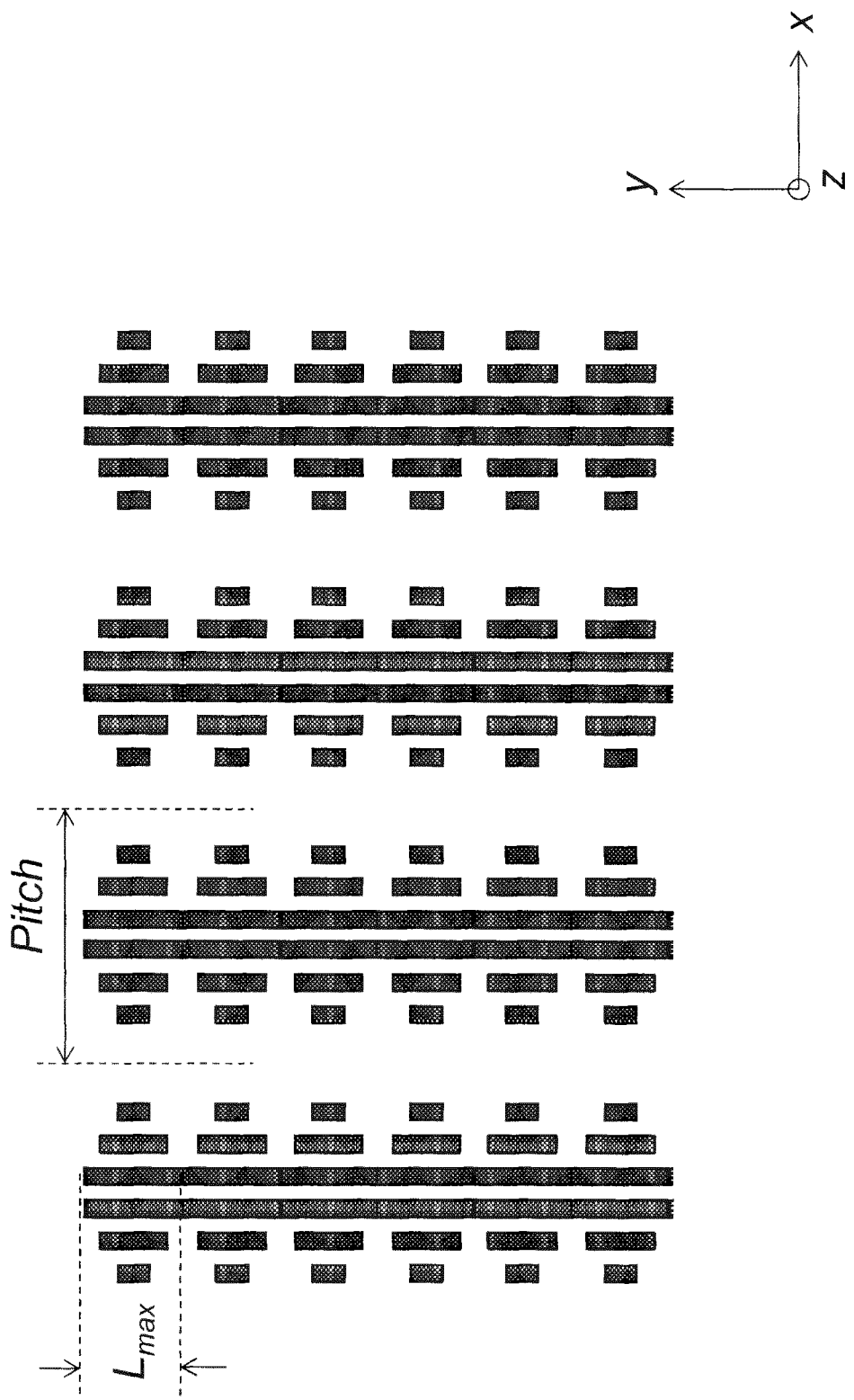

ALTERNATIVE TARGET DESIGN FOR METROLOGY USING MODULATION TECHNIQUES

CROSS-REFERENCE TO RELATED APPLICATIONS

This application is the U.S. national phase entry of PCT patent application no. PCT/EP2016/080742, which was filed on Dec. 13, 2016, which claims the benefit of priority of U.S. provisional application No. 62/387,571, which was filed on Dec. 28, 2015, and which is incorporated herein in its entirety by reference.

FIELD OF THE DISCLOSURE

The present disclosure relates to methods and apparatus for designing targets for measuring overlay and alignment of patterns using diffraction based optics.

BACKGROUND OF THE RELATED ART

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti parallel to this direction. It is also possible to transfer the pattern from the patterning device to the substrate by imprinting the pattern onto the substrate.

In lithographic processes, it is desirable frequently to make measurements of the structures created, e.g., for process control and verification. Various tools for making such measurements are known, including scanning electron microscopes, which are often used to measure critical dimension (CD), and specialized tools to measure overlay (the accuracy of alignment of two layers in a device) and/or defocus of the lithographic apparatus. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

The targets used by conventional scatterometers are relatively large, e.g., 40 μm by 40 μm, gratings and the measurement beam generates a spot that is smaller than the grating (i.e., the grating is underfilled). This simplifies mathematical reconstruction of the target as it can be regarded as infinite. However, in order to reduce the size of the targets, e.g., to 10 μm by 10 μm or less, e.g., so they can be positioned in amongst product features, rather than in the scribe lines, metrology has been proposed in which the grating is made smaller than the measurement spot (i.e., the grating is overfilled). Typically such targets are measured using dark-field scatterometry in which the zeroth order of diffraction (corresponding to a specular reflection) is blocked, and only higher orders processed.

Diffraction-based overlay (DBO) using dark-field detection of the diffraction orders enables overlay measurements on smaller targets. These targets can be smaller than the illumination spot and may be surrounded by product structures on a wafer. Multiple targets can be measured in one image.

In the known metrology technique, overlay measurement results are obtained by measuring the target twice under certain conditions, while either rotating the target or changing the illumination mode or imaging mode to obtain separately the $-1^{st}$ and the $+1^{st}$ diffraction order intensities. Comparing these intensities for a given grating provides a measurement of asymmetry in the grating.

The effective exposure dose, arising from the combination of lithographic apparatus, reticle and processing, is typically measured through line width (critical dimension, CD) of critical product structures. Inspection apparatus used for such measurements includes metrology tools such as CD-SEM (Scanning Electron Microscope) and scatterometers.

However, CD-SEM is relatively slow and has high noise levels. Furthermore, although scatterometers are very sensitive metrology tools, aberration in the lithography apparatus (i.e. the exposure system) can cause device matching error. Current metrology targets used in scatterometry are limited to regular grating at large pitch (400-800 nm) with possible sub-segmentation line and/or space. Aberration can cause physical shift, profile asymmetry or segmentation asymmetry in metrology target. In some memory applications, lines are printed under extreme dipole illumination, which can have horizontal, lateral or rotated orientation. What is needed is better control at the design stage of metrology targets compatible to illumination mode and other process constraints so that image aberration problems are mitigated.

SUMMARY OF THE DISCLOSURE

Disclosed herein is a target structure, wherein the target structure is configured to be measured with a metrology tool, the metrology tool having a diffraction threshold; the target structure comprising: one or more patterns supported on a substrate, the one or more patterns being periodic with a first period in a first direction and periodic with a second period in a second direction, the first direction and second direction being different and parallel to the substrate, the first period being equal to or greater than the diffraction threshold and the second period is less than the diffraction threshold.

According to an embodiment, the one or more patterns are configured to enhance a first order of diffraction from the target structure in the first direction at the expense of an order of the diffraction higher than the first order.

According to an embodiment, the one or more patterns are configured such that diffraction from the target structure in the second direction has only a zero-th order.

According to an embodiment, the one or more patterns are configured such that the metrology tool is able to measure alignment or overlay from the one or more patterns.

According to an embodiment, the one or more patterns are formed with a photoresist.

According to an embodiment, the one or more patterns are etched into the substrate.

According to an embodiment, the one or more patterns have a different height in a direction perpendicular to the substrate than objects surrounding the patterns.

According to an embodiment, the one or more patterns have a different optical property than objects surrounding the patterns.

According to an embodiment, the first direction is perpendicular to the second direction.

According to an embodiment, the first period is a period of a dimension of the one or more patterns in a direction other than the first direction.

According to an embodiment, a dimension of the one or more patterns in a direction other than the first direction is a sine function of a location of the one or more patterns in the first direction.

According to an embodiment, the one or more patterns comprise lines in the second direction.

According to an embodiment, the lines have an equal size in the first direction.

According to an embodiment, each of the lines has a uniform size in the first direction.

Disclosed herein is a substrate, comprising any of the above target structures and patterns representing a structure of an electronic device.

Disclosed herein is a method of fabricating any of the above target structures, the method comprising: fabricating a plurality of parallel lines on the substrate; forming the one or more patterns by changing a length of the lines.

According to an embodiment, fabricating the lines comprises exposure with a first patterning device and forming the patterns comprises exposure with a second patterning device.

Disclosed herein is a computer implemented method of measuring overlay between structures on two different layers of an electronic device, where each of the two layers comprises a target structure and at least one of the target structures on the two layers is any of the above target structures, the method comprising: measuring diffraction orders from the target structures; determining an overlay error from the diffraction orders.

Disclosed herein is a computer implemented method of aligning to an existing structure on a substrate, wherein the substrate comprises any of the above target structures, the method comprising: measuring diffraction orders from the target structure; determining an alignment error from the diffraction orders.

Disclosed herein is a computer-readable non-transitory medium, having electronic data stored thereon, wherein the electronic data represent any of the above target structures.

Disclosed herein is a method of measuring alignment or overlay using a target structure on a substrate, the method comprising: measuring diffraction orders of diffraction in a first direction from the target structure, wherein the target structure is configured to enhance a first order of the diffraction in the first direction at the expense of an order of the diffraction higher than the first order; wherein diffraction from the target structure in a second direction has only a zero-th order, the first direction and the second direction being different and parallel to the substrate; determining an alignment error or an overlay error from the diffraction orders of diffraction in the first direction.

According to an embodiment, diffraction orders of diffraction in the first direction higher than the first order are not enhanced by the target structure.

According to an embodiment, the first direction is perpendicular to the second direction.

According to an embodiment, the target structure comprises one or more patterns, the one or more patterns being periodic with a first period in the first direction and periodic with a second period in the second direction.

According to an embodiment, the first period is a period of a dimension of the one or more patterns in a direction other than the first direction.

According to an embodiment, the target structure is formed with a photoresist.

According to an embodiment, the target structure is etched into the substrate.

According to an embodiment, the target structure comprises lines in the second direction.

According to an embodiment, the lines have an equal size in the first direction.

According to an embodiment, each of the lines has a uniform size in the first direction.

A computer-readable non-transitory medium having instructions thereon, the instructions when executed by a computer implementing any of the above methods.

BRIEF DESCRIPTION OF THE DRAWINGS

These and other aspects and features of the present disclosure will become apparent to those ordinarily skilled in the art upon review of the following description of specific embodiments of the disclosure in conjunction with the accompanying figures, wherein:

FIG. 5A depicts a cross sectional view of a standard grating;

FIGS. 5B-D depict the principle of overlay measurement between two vertical layers of gratings using diffraction-based scatterometry;

FIG. 10 depicts another embodiment of a fully modulated grating structure, according to an embodiment of the present disclosure;

DETAILED DESCRIPTION

This specification discloses one or more embodiments that incorporate the features of this disclosure. The disclosed embodiment(s) merely exemplify the inventive concepts. The scope of the disclosure is not limited to the disclosed embodiment(s). The disclosure is defined by the claims appended hereto. The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to affect such feature, structure, or characteristic in connection with other embodiments whether or not explicitly described.

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Figure 1:
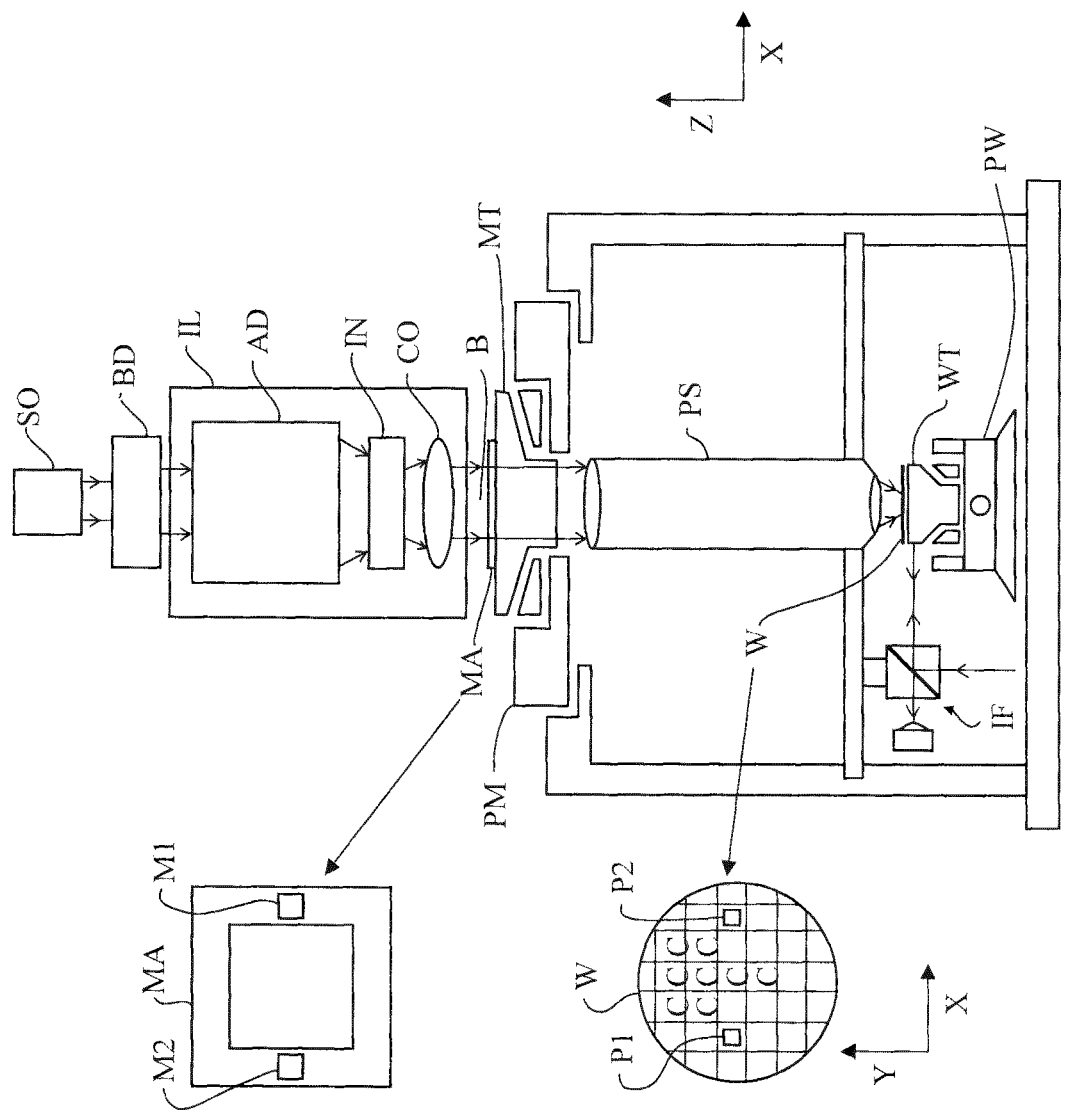
FIG. 1 depicts a lithographic apparatus according to an embodiment of the present disclosure.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types.

An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

In general, movement of the patterning device support (e.g., mask table) MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the patterning device support (e.g., mask table) MT may be connected to a short-stroke actuator only, or may be fixed.

Patterning device (e.g., mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. The alignment system, which detects the alignment markers is described further below.

The depicted apparatus could be used in at least one of the following modes:

1. In step mode, the patterning device support (e.g., mask table) MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WT are scanned synchronously while a pattern imparted to the radiation beam is projected onto a target portion C (i.e., a single dynamic exposure). The velocity and direction of the substrate table WT relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

A dark field metrology apparatus suitable for use in embodiments of the disclosure is shown in FIG. 2(a), although the disclosure is not limited to dark-field scatterometry only. In the example shown in FIG. 2(a), a target grating T and diffracted rays are illustrated in more detail in FIG. 2(b). The dark field metrology apparatus may be a stand-alone device or incorporated in either the lithographic apparatus LA, e.g., at the measurement station, or the lithographic cell. An optical axis, which has several branches throughout the apparatus, is represented by a dotted line O. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 2(b), target grating T is placed with substrate W normal to the optical axis O of objective lens 16. A ray of illumination I impinging on grating T from an angle off the axis O gives rise to a zeroth order ray (solid line 0) and two first order rays (dot-chain line +1 and double dot-chain line −1). It should be remembered that with an overfilled small target grating, these rays are just one of many parallel rays covering the area of the substrate including metrology target grating T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches and illumination angles can be designed or adjusted so that the first order rays entering the objective lens are closely aligned with the central optical axis. The rays illustrated in FIGS. 2(a) and 2(b) are shown somewhat off axis, purely to enable them to be more easily distinguished in the diagram.

At least the 0 and +1 or −1 orders diffracted by the target on substrate W are collected by objective lens 16 and directed back through beam splitter 15. Returning to FIG. 2(a), both the first and second illumination modes are illustrated, by designating diametrically opposite apertures labeled as north (N) and south (S). In other embodiments, East E and West (W) labels may be used depending on the position of the apertures. When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16.

A second beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image for an underfilled target may be used as an input for dose and focus metrology, in accordance with embodiments of the present disclosure.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to image processor and controller PU, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 2(a) are purely examples. In another embodiment of the disclosure, on-axis illumination of the targets is used and an aperture stop with an off-axis aperture is used to pass substantially only one first order of diffracted light to the sensor. In yet other embodiments, $2^{nd}$, $3^{rd}$ and higher order beams (not shown in FIG. 2(b)) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Alternatively or in addition, a set of plates 13 could be provided and swapped, to achieve the same effect. A programmable illumination device such as a deformable mirror array or transmissive spatial sight modulator (SLM) can be used also. Moving mirrors or prisms can be used as another way to adjust the illumination mode.

As just explained in relation to aperture plate 13, the selection of diffraction orders for imaging can alternatively be achieved by altering the pupil-stop 21, or by substituting a pupil-stop having a different pattern, or by replacing the fixed field stop with a programmable spatial light modulator. In that case the illumination side of the measurement optical system can remain constant, while it is the imaging side that has first and second modes. In the present disclosure, therefore, there are effectively three types of measurement method, each with its own advantages and disadvantages. In one method, the illumination mode is changed to measure the different orders. In another method, the imaging mode is changed. In a third method, the illumination and imaging modes remain unchanged, but the target is rotated through 180 degrees. In each case the desired effect is the same, namely to select first and second portions of the non-zero order diffracted radiation which are symmetrically opposite one another in the diffraction spectrum of the target. In principle, the desired selection of orders could be obtained by a combination of changing the illumination modes and the imaging modes simultaneously, but that is likely to bring disadvantages for no advantage, so it will not be discussed further.

While the optical system used for imaging in the present examples has a wide entrance pupil which is restricted by the field stop 21, in other embodiments or applications the entrance pupil size of the imaging system itself may be small enough to restrict to the desired order, and thus serve also as the field stop.

Typically, a target grating will be aligned with its grating lines running either north-south or east-west. That is to say, a grating will be aligned in the X direction or the Y direction of the substrate W. Note that aperture plate 13N or 13S can only be used to measure gratings oriented in one direction (X or Y depending on the set-up). For measurement of an orthogonal grating, rotation of the target through 90° and 270° might be implemented. As mentioned already, the off-axis apertures could be provided in field stop 21 instead of in illumination aperture plate 13. In that case, the illumination would be on axis.

Additional aperture plates can be used to combine the illumination modes described above. Provided that crosstalk between these different diffraction signals is not too great, measurements of both X and Y gratings can be performed without changing the illumination mode.

Figure 3:
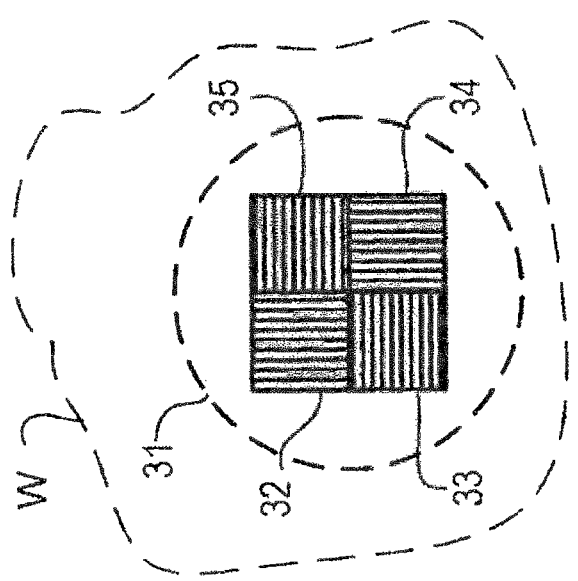
FIG. 3 depicts a top view of a known form of multiple grating target and an outline of a measurement spot on a substrate.

FIG. 3 depicts the top view of a composite target formed on a substrate according to known practice. The composite target comprises four gratings 32 to 35 positioned closely together so that they will all be within a measurement spot 31 formed by the illumination beam of the metrology apparatus. The four targets thus are all simultaneously illuminated and simultaneously imaged on sensors 19 and 23. Gratings 32 to 35 may differ in their orientation, as shown, so as to diffract incoming radiation in X and Y directions. In one example, gratings 32 and 34 are X-direction gratings. Gratings 33 and 35 are Y-direction gratings. Separate images of these gratings can be identified in the image captured by sensor 23.

Figure 4:
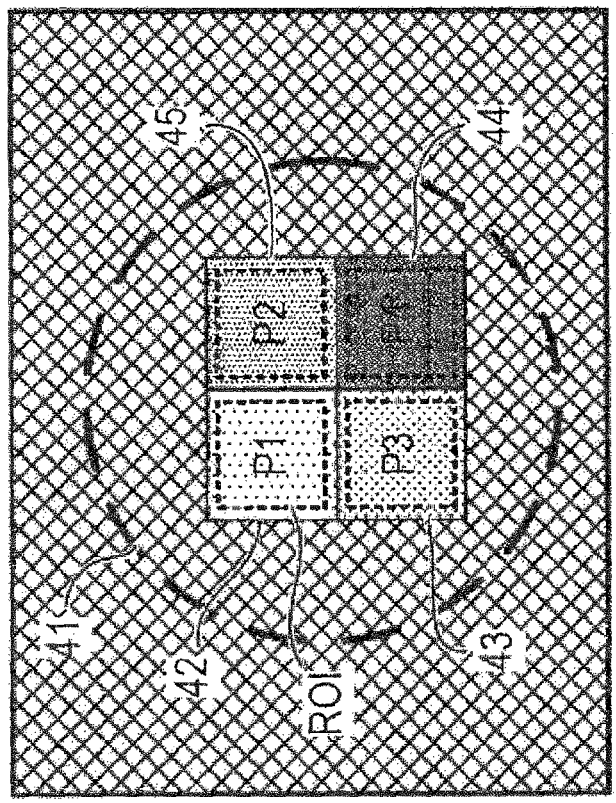
FIG. 4 depicts an image of the target of FIG. 3 obtained in the scatterometer of FIG. 2(a)

FIG. 4 shows an example of an image that may be formed on and detected by the sensor 23, using the target of FIG. 3 in the apparatus of FIG. 2(a). While the pupil plane image sensor 19 cannot resolve the different individual gratings 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the gratings are located in product areas, product features may also be visible in the periphery of this image field. Image processor and controller PU processes these images using pattern recognition to identify the separate images 42 to 45 of gratings 32 to 35. In this way, the images do not have to be aligned very precisely at a specific location within the sensor frame, which greatly improves throughput of the measuring apparatus as a whole. However the need for accurate alignment remains if the imaging process is subject to non-uniformities across the image field. In one embodiment of the disclosure, four positions P1 to P4 are identified and the gratings are aligned as much as possible with these known positions.

Once the separate images of the gratings have been identified, the intensities of those individual images can be measured, e.g., by averaging or summing selected pixel intensity values within the identified areas. Intensities and/or other properties of the images can be compared with one another. These results can be combined to measure different parameters of the lithographic process, such as focus, exposure dose etc. Also, in some embodiments, fragmented images can be stitched together using metrology date from overlay and alignment measurements.

While the target structures described above are metrology targets specifically designed and formed for the purposes of measurement, in other embodiments, properties may be measured on targets which are functional parts of devices formed on the substrate. Many devices have regular, grating-like structures. The terms 'target grating' and 'target structure' as used herein do not require that the structure has been provided specifically for the measurement being performed.

Figure 2:
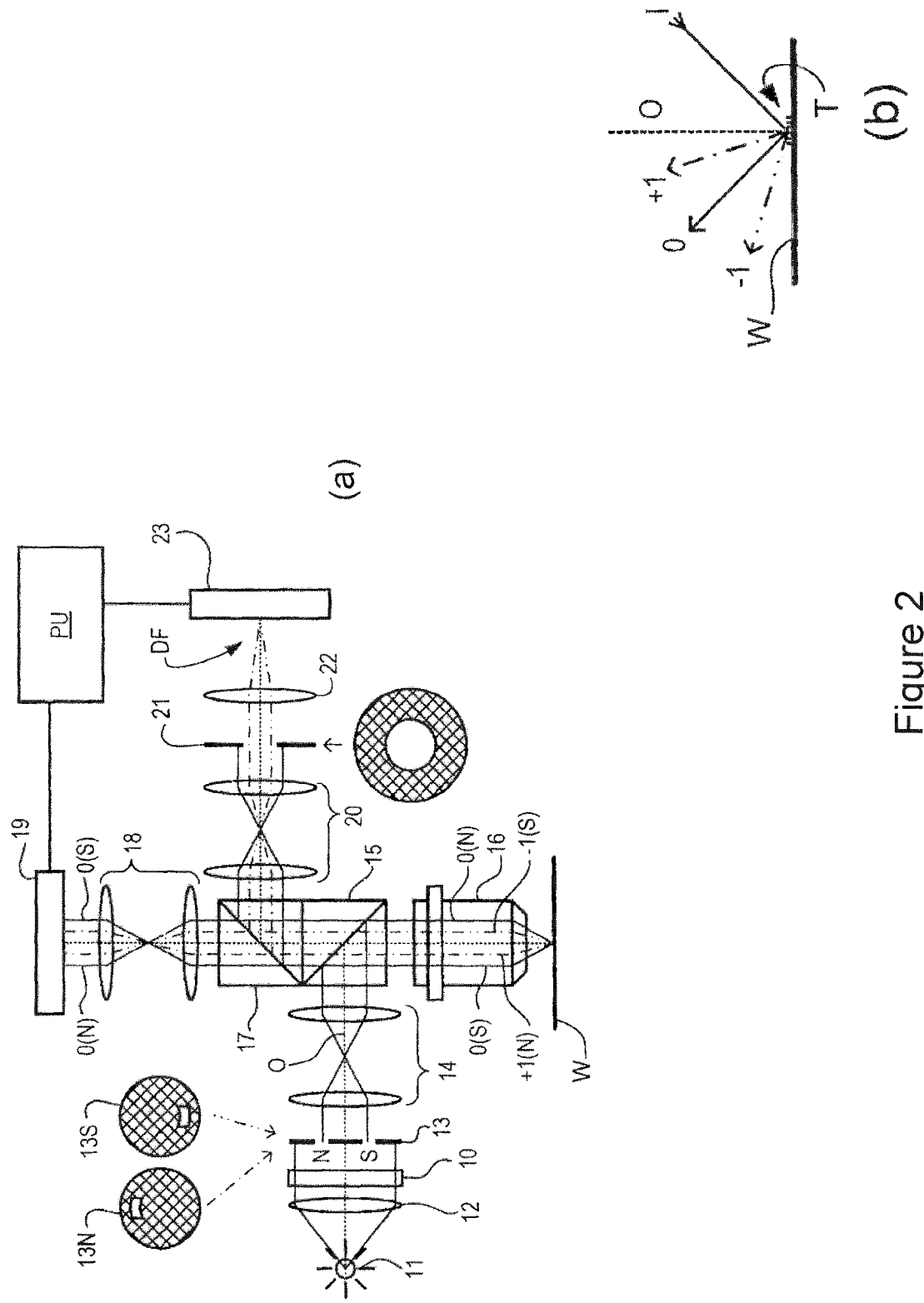
FIG. 2(a) shows a schematic diagram of a dark-field scatterometer for use in measuring targets according to embodiments of the disclosure using a first pair of illumination apertures.
FIG. 2(b) shows a detail of diffraction spectrum of a target grating for a given direction of illumination.

In association with the physical grating structures of the targets as realized on substrates and patterning devices, an embodiment may include a computer program containing one or more sequences of machine-readable instructions describing a methods of producing targets on a substrate, measuring targets on a substrate and/or analyzing measurements to obtain information about a lithographic process. This computer program may be executed for example within unit PU in the apparatus of FIG. 2 and/or a control unit in the lithography apparatus. There may also be provided a data storage medium (e.g., semiconductor memory, magnetic or optical disk) having such a computer program stored therein. Where an existing metrology apparatus, for example of the type shown in FIG. 2, is already in production and/or in use, the disclosure can be implemented by the provision of updated computer program products for causing a processor to perform the methods described herein and so calculate exposure dose. The program may optionally be arranged to control the optical system, substrate support and the like to perform the steps for measurement of a suitable plurality of target structures. Interested readers may find more details of the scatterometry process in co-owned international patent application published as WO 2014/082938, titled, "Method of Determining Dose and Focus, Inspection, Apparatus, Patterning Device, Substrate and Device Manufacturing Method," which is incorporated by reference in its entirety.

FIG. 5A illustrates the cross sectional view a standard single-layer grating pattern. In FIG. 5A, a limited section of only five periods of the grating is shown. The grating period is Pd, horizontal line width of individual grating lines is wl, and vertical thickness of each grating line is t. In the full grating, the pattern may repeat in the horizontal (x axis) or lateral (y axis) directions. The grating pattern in FIG. 5A may comprise, for example, a chrome pattern on a reticle. The parameters Pd, wl, and t may be used to describe aspects of the grating, along with other parameters.

While the example in FIG. 3 shows grating sections that may be on a same device layer and used for same-layer alignment and/or image stitching purposes, FIGS. 5B-D show how grating-based metrology structures can be used to measure overlay between two different layers in an electronic device. A first grating G1 is on layer one, and a second grating G2 is on layer two, where the two layers mimic device layers in an actual device to be manufactured (also referred to as "product"). The device may have a first pattern in layer one and a second pattern in layer two, and the overlay between those two patterns are of interest. FIG. 5B shows overlay error in one direction (along the horizontal x axis), and FIG. 5D shows overlay error in the opposite direction (along the horizontal −x axis). The x axis is also referred to as the direction of overlay. FIG. 5C shows the ideal case where there is no overlay error between G1 and G2, as they are aligned (along the vertical z direction) perfectly. Persons skilled in the art would appreciate that a designer may intentionally add positive or negative bias along the x direction for image matching purposes, and measure the effect of bias by measuring the variation of intensity (I) of the diffracted beams. Here, only the zero-order, +1 order and −1 order diffracted beams are shown for simplicity, and higher order beams are not shown.

The present disclosure describes various types of structure as metrology targets for overlay and alignment measurement. The aim is to enhance the intensity of the $1^{st}$ order scattered signal for overlay measurement. The target with modulated geometric structures can be used as target to measure overlay with ASML YieldStar or other optical diffraction based overlay measurement system. The fundamental principle is that geometric target with modulated lateral width enhances the $1^{st}$ order diffraction at the expense of any higher orders.

In an embodiment, a target structure (also interchangeably referred to as a "target") includes one or more patterns supported on a substrate. The one or more patterns are periodic in a first direction and a second direction. Both the first direction and the second direction are parallel to the substrate. The first and second directions are different. The first direction may be perpendicular to the second direction. A metrology tool having a diffraction threshold can measure the target structure. The period of the one or more patterns in the first direction is equal to or greater than the diffraction threshold. The period of the one or more patterns in the second direction is smaller than the diffraction threshold. The diffraction threshold of the metrology is a distance, where if a grating has a period smaller than that distance, diffraction of the grating has only the zero-th order and if a grating has a period equal to greater than that distance, diffraction of the grating has at least a diffraction order other than the zero-th order. The one or more patterns may be configured to enhance a first order of diffraction from the target structure in the first direction at the expense of an order of the diffraction higher than the first order. The one or more patterns may be configured such that diffraction from the target structure in the second direction has only a zero-th order. The one or more patterns may be configured such that the metrology tool is able to measure alignment or overlay from the one or more patterns.

The one or more patterns may be formed with a photoresist. The one or more patterns may be etched into the substrate. The one or more patterns may have a different height in a direction perpendicular to the substrate than objects surrounding the patterns. The one or more patterns may have a different optical property than objects surrounding the patterns.

Figure 6:
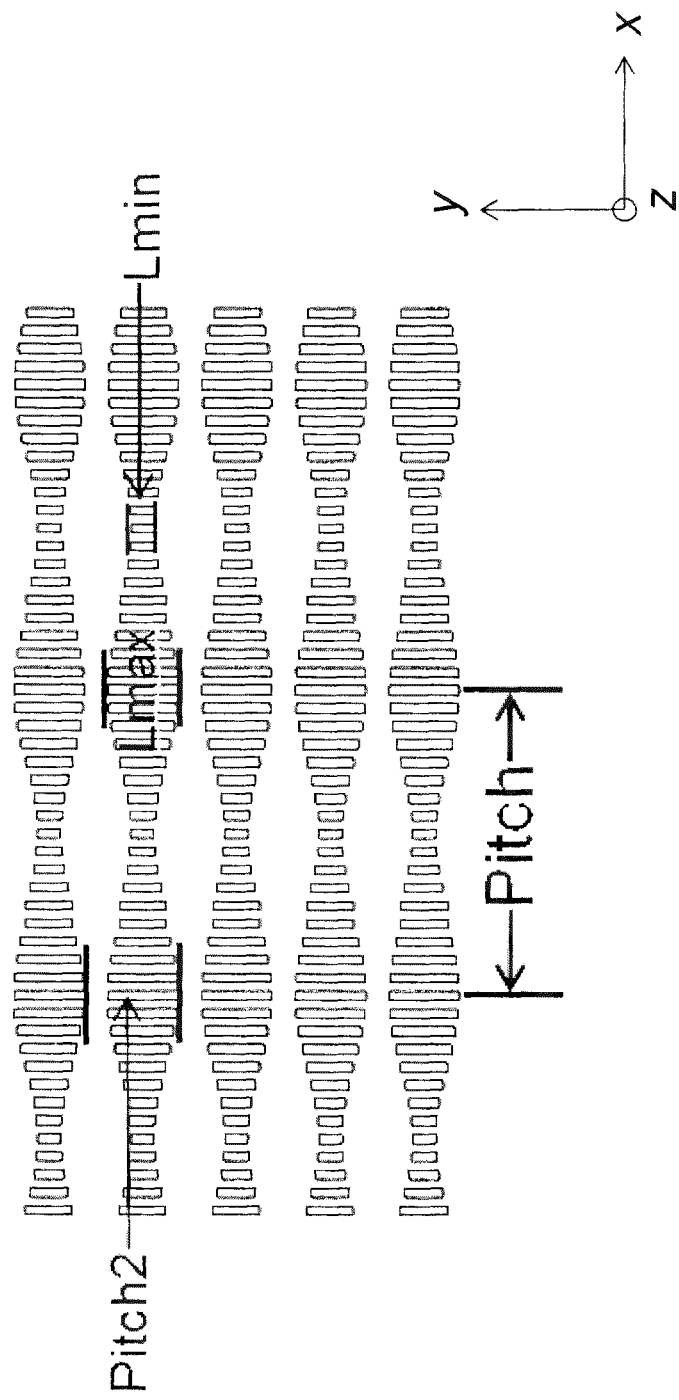
FIG. 6 depicts a curvilinear grating structure and geometric design parameters, according to an embodiment of the present disclosure.

FIG. 6 shows an example of such a target structure. The first direction is depicted as the x direction and the second direction is depicted as the y direction. The period in the x direction is labeled as "Pitch" and the period in the y direction is labeled as "Pitch2." The period in the first direction may be a period of a dimension of the one or more patterns in a direction other than the first direction. In the example of FIG. 6, the one or more patterns include a series of lines extending in the y direction and the period in the first direction is a period in the lengths of these lines. The lines may have equal width in the x direction. The width in the x direction of any one of the lines may be uniform along the entire length of that one line. A dimension of the one or more patterns in a direction other than the first direction may be a sine function of a location of the one or more patterns in the first direction.

In the example, the lengths of the lines in the y direction are modulated with a maximum of $L_{max}$ and a minimum of $L_{min}$. The separation between neighboring locations of $L_{max}$ and $L_{min}$ may be half the Pitch. The difference between $L_{max}$ and $L_{min}$ may be less than or equal to Pitch2. $L_{max}$ can be as large as Pitch2, and $L_{min}$ can be as small as zero, as shown in the example of FIG. 10. These geometric parameters (e.g., Pitch, Pitch2, $L_{max}$ and $L_{min}$) of the target structure can be adjusted to improve detectability and printability of the target structure.

The substrate on which the one or more patterns are supported may also include patterns representing a structure of an electronic device.

The target structure disclosed here may be used as alignment targets used for aligning a substrate in a lithography apparatus used for fabricating electronic devices on the substrate. The first direction may be a direction of alignment. The target structure may comprise a single layer corresponding to a single layer of the electronic device fabricated on the substrate. The target structure may comprise two layers corresponding to two layers of the electronic device fabricated on the substrate.

In an embodiment, the target structure allows close match to aberration sensitivity of the patterns representing a structure of an electronic device. Aberration arises due to the change of wavefront shape when the beam travels through the projection optics and other beam shaping optical components. The metrology tool and the lithography apparatus may not have identical optical characteristics. The target structure may be configured to reduce its sensitivity to the aberration mismatch between the metrology tool and the lithography apparatus. The target structure can be defined using one mask (as in the case of FIG. 6), or two masks (as shown in the embodiment in FIGS. 7-9) already used in product manufacturing.

Figure 7:
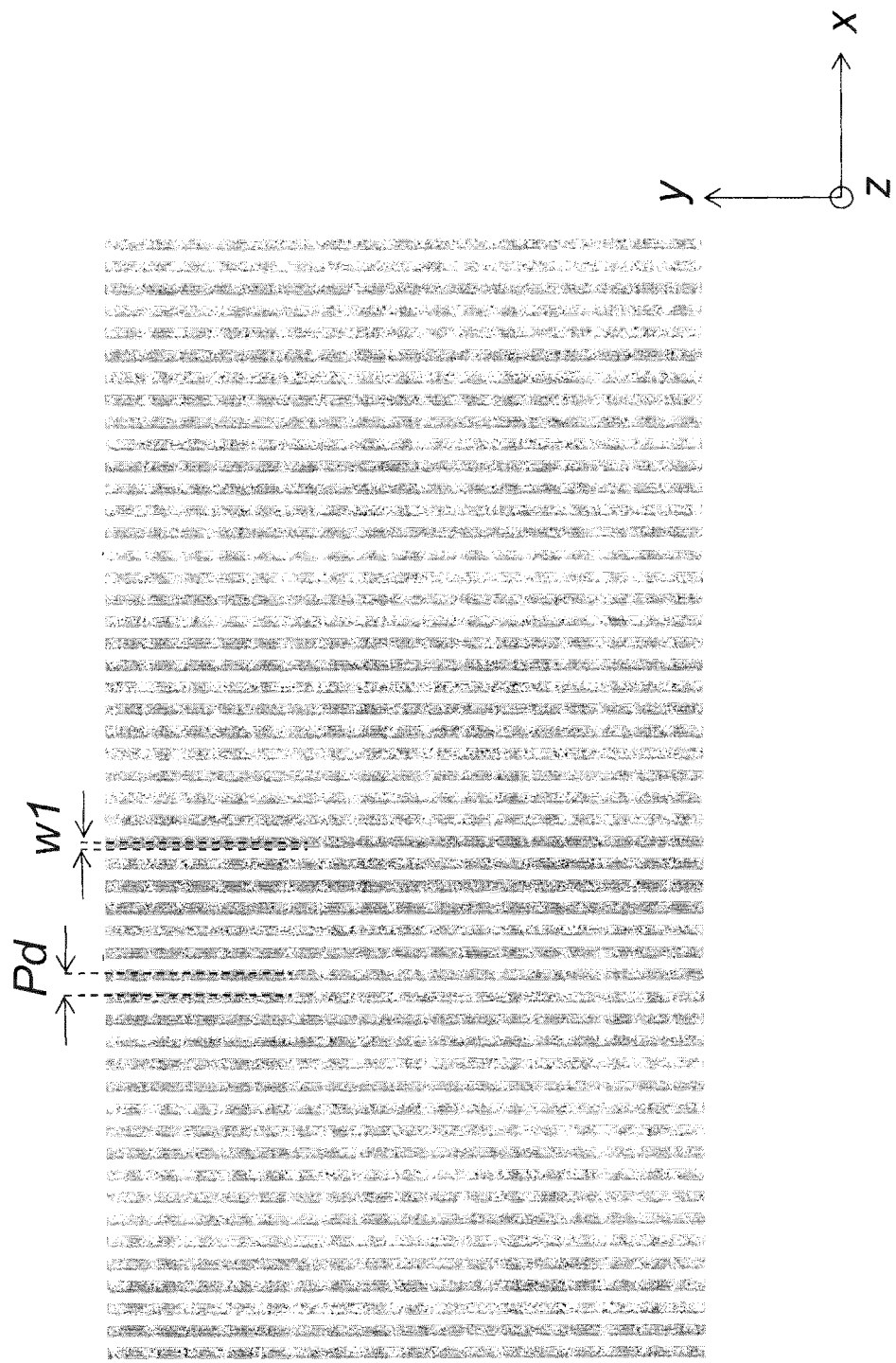
FIGS. 7, 8, 9A-9B depict a grating structure created using two masks, according to an embodiment of the present disclosure.
Figure 8:
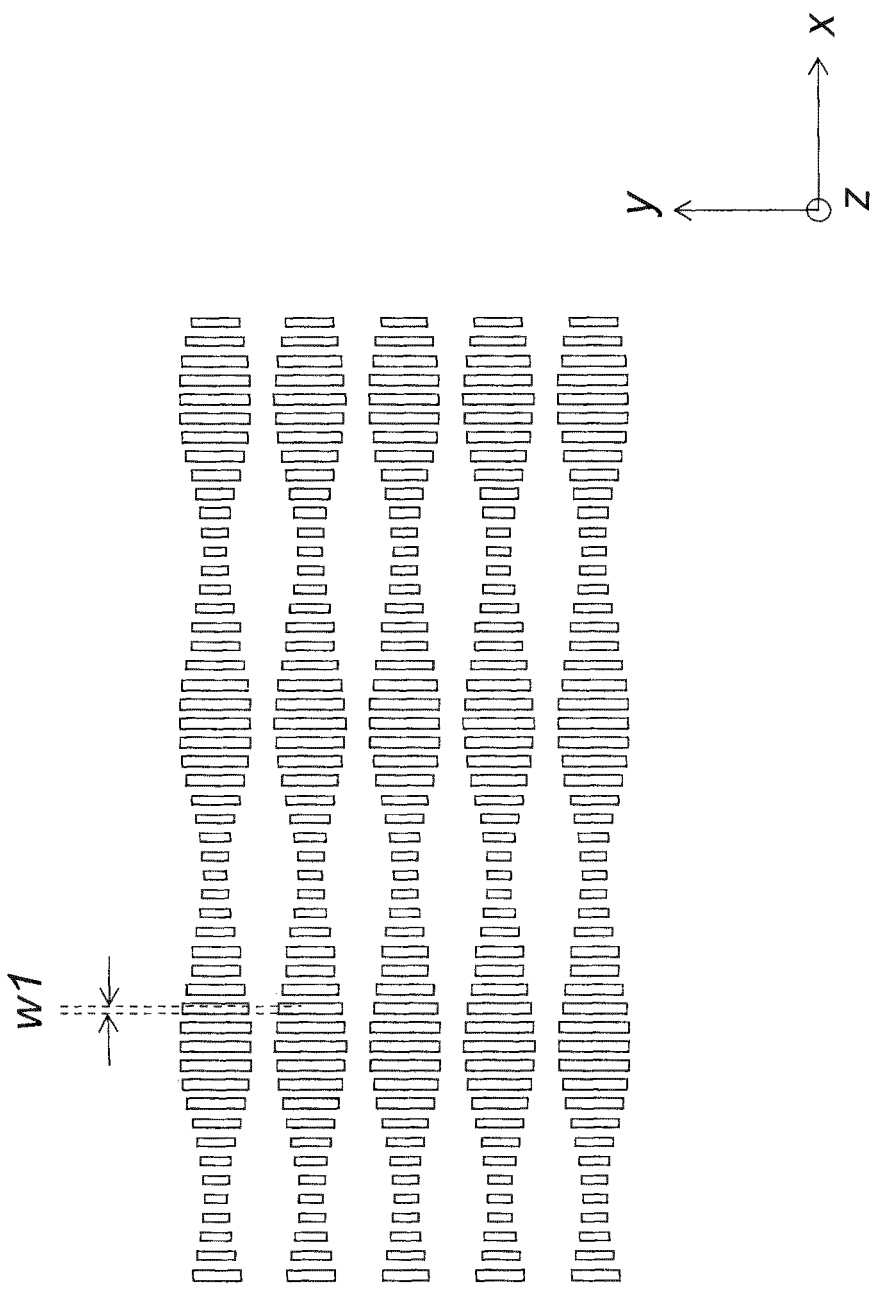

The target structure shown in FIG. 6 may be made using a single mask. FIG. 7 and FIG. 8 show that the target structure of FIG. 6 may be made using two masks. The first mask comprises dense uniform lines, as shown in FIG. 7. The line and space characteristics in the first mask may closely match patterns representing a structure of an electronic device. For example, if the lines are at an angle to patterns representing a structure of an electronic device, a rotational dipole illumination may be used to achieve better metrology measurement.

Figure 9A:
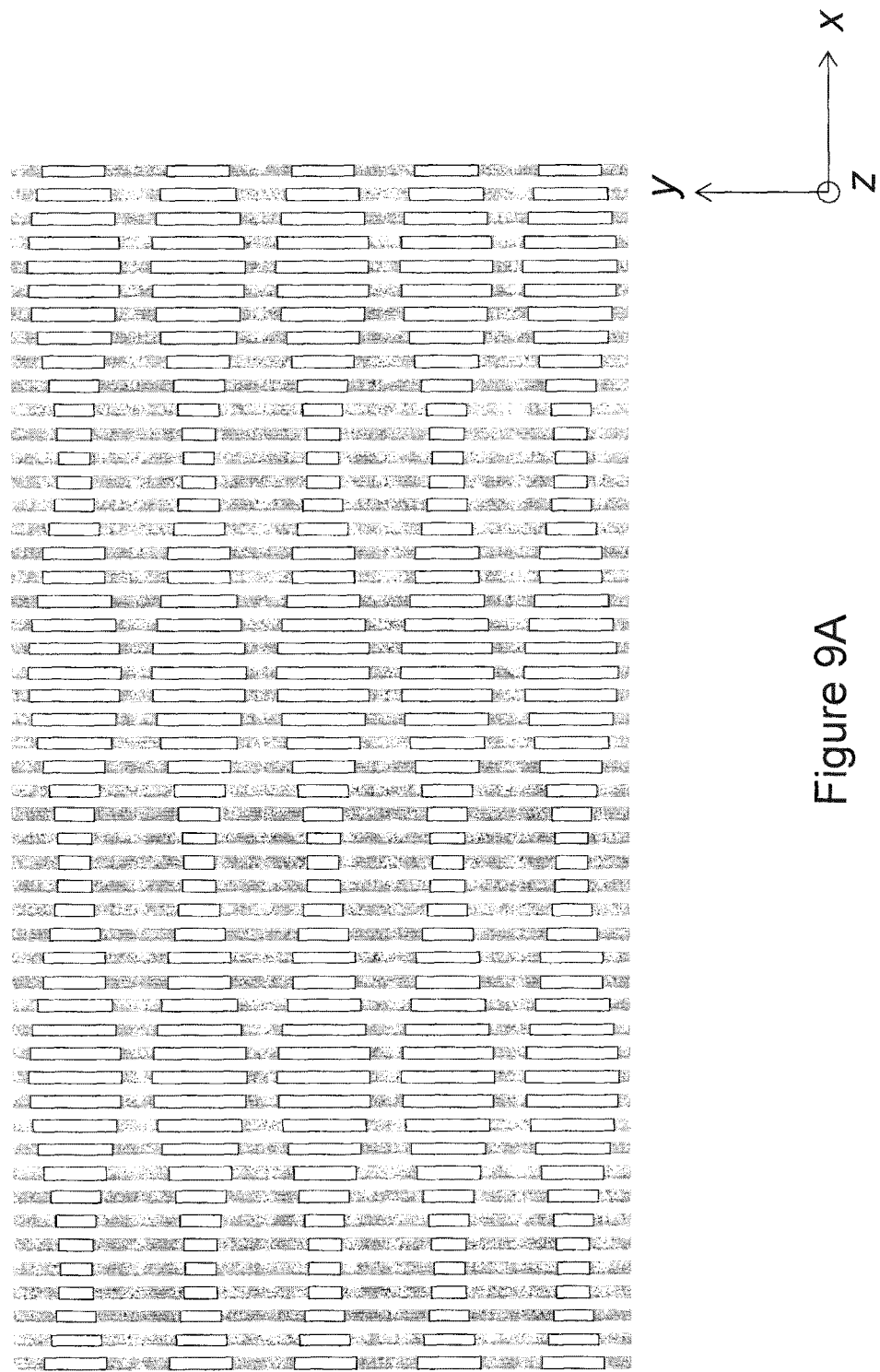
Figure 9B:
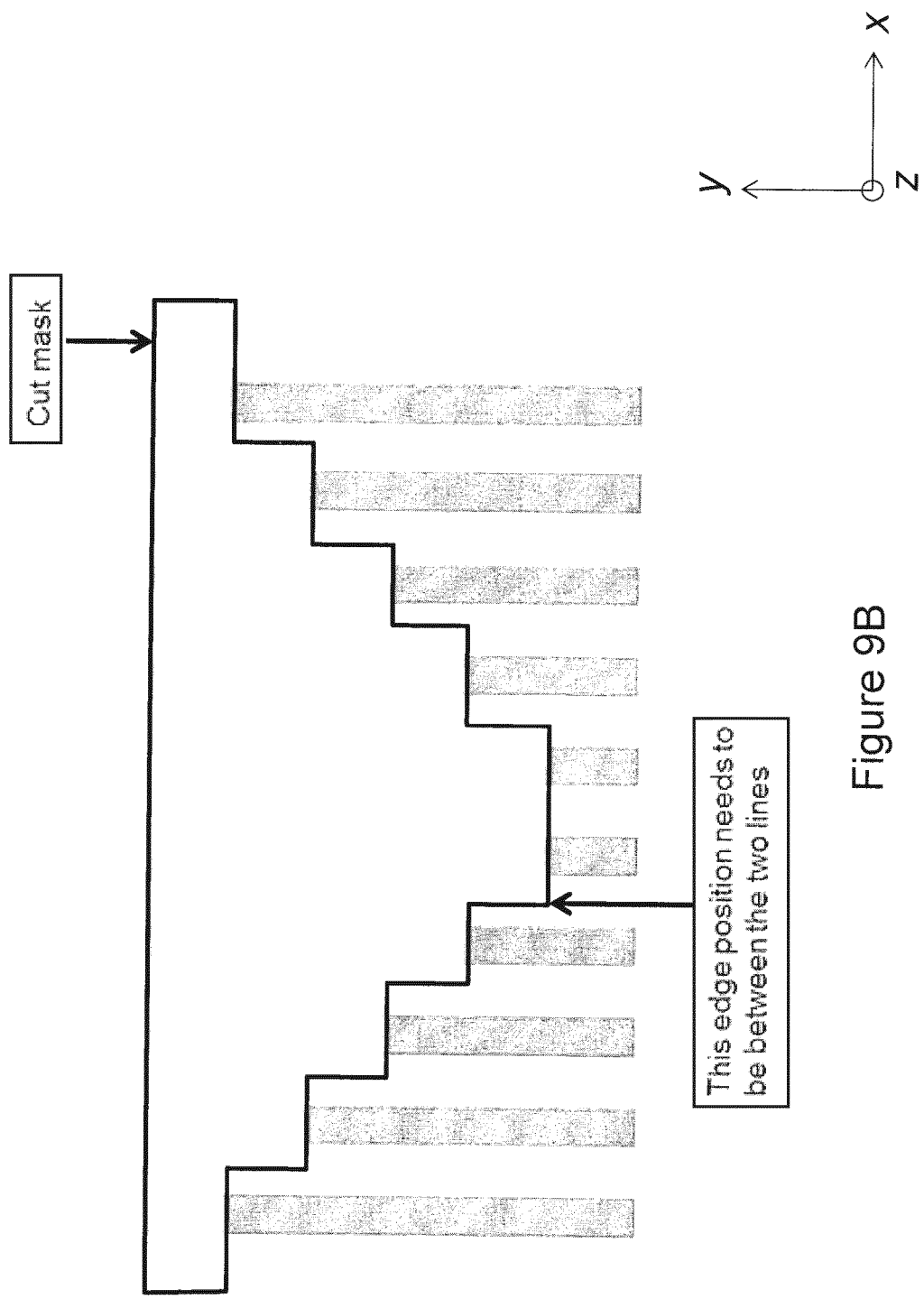

A second mask, called a "cut mask" is shown in FIG. 8. When the substrate with the lines made using the first mask of FIG. 7 is aligned to and exposed with the cut mask, parts of the lines are removed. The remainder of the lines is the white portions of the dark lines, as shown in FIG. 9A. FIG. 9B shows an example where the cut mask is a continuous stair-case like structure. The edges of the staircases may be positioned between two neighboring lines.

A method of fabricating the target structure disclosed here may include: fabricating a plurality of parallel lines on the substrate; forming the one or more patterns by changing a length of the lines. Fabricating the lines may comprise exposure with a first patterning device and forming the patterns comprises exposure with a second patterning device.

The geometric parameters (e.g., Pitch, Pitch2, $L_{max}$ and $L_{min}$) may be adjusted by simulation. In the example of using two masks, geometric parameters may be tuned to improve detectability and printability; aberration matching may be achieved by design. In the example of using one mask, the geometric parameters may be adjusted to achieve relative good aberration matching as well as good detectability and printability. For overlay targets, the geometric parameter tuning can be performed combining with the target parameters of the other layer with respect to which overlay to be measured. Such combined tuning typically can give better aberration match and detectability for overlay targets. For alignment target in the same device layer, tuning is simpler.

As described above, the parameters marked in FIG. 6 can be tuned and adjusted to achieve best metrology performance. The degree of sinusoidal modulation may vary. FIG. 10 shows an example of target that uses full modulation. In FIG. 10, Pitch2=$L_{max}$, so that the center lines are connected and $L_{min}$=0. The parameter adjustment not only helps to achieve better metrology performance, but also helps to comply with some design constraints that conventional targets cannot achieve.

The above description and illustrations in FIGS. 6-10 are for extreme dipole illumination in the x direction. For extreme dipole illumination in the y direction, the target typically needs to rotate 90 degree. For rotated extreme dipole illumination, the modulated structure usually rotates to match dipole illumination angle and to be consistent with product feature when created using two masks. This will give good aberration sensitivity match to product and improved printability. When the metrology structure is created using just one mask, the designer can choose to rotate the grating lines to match dipole illumination angle if printability improves.

Figure 11:
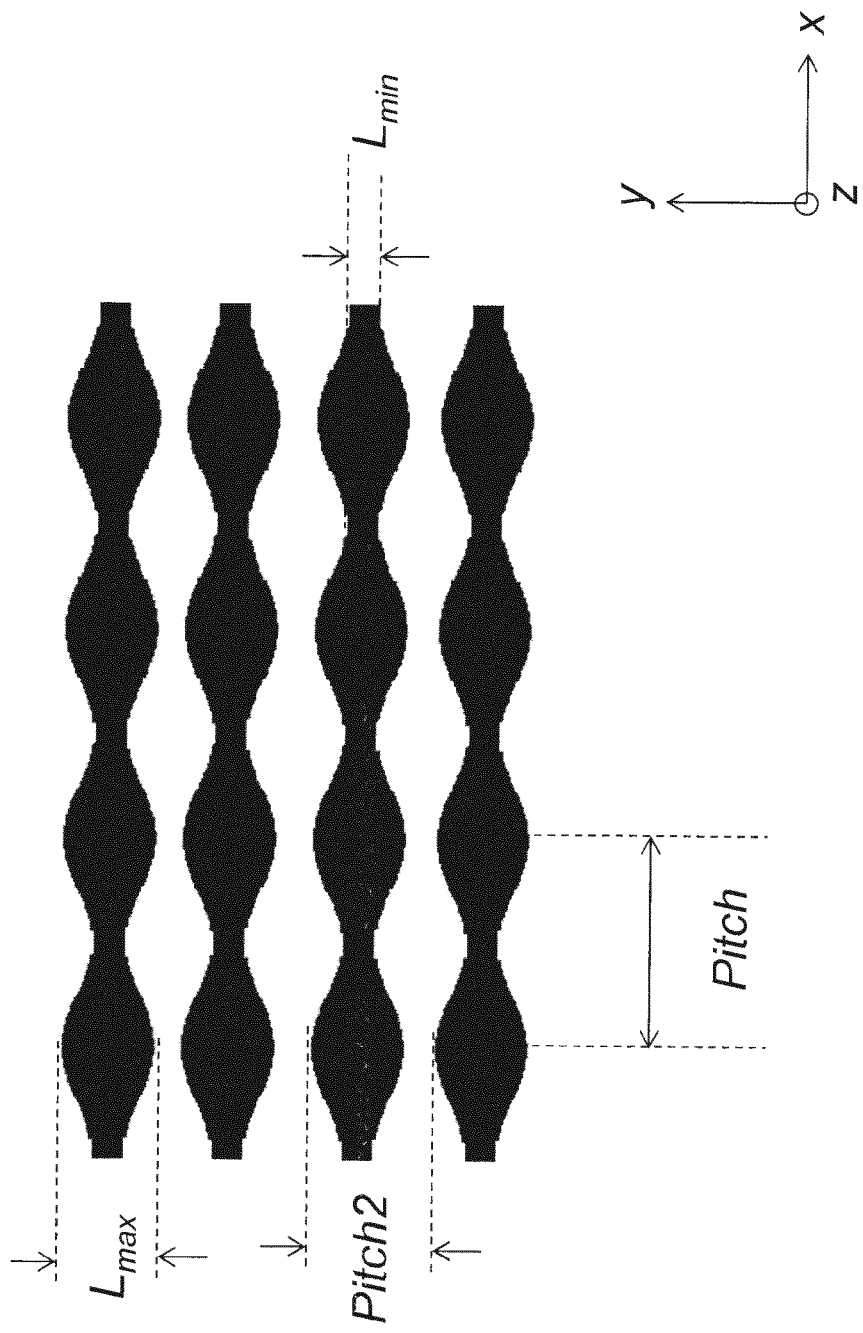
FIG. 11 depicts a solid curvilinear grating structure and corresponding geometric parameters, according to an embodiment of the present disclosure; and, FIG. 12 depicts a flowchart of a method of designing a metrology target using modulated geometric parameters, according to the present disclosure.

FIG. 11 shows a slightly modified embodiment. Similar to the embodiments shown in FIGS. 6-10, the embodiment in FIG. 11 also uses sinusoidal modulation of lateral width to enhance the $1^{st}$ order diffraction for overlay and alignment measurement. However, instead of using small line segments to construct a sinusoidal geometric shape as in the previous embodiments, the embodiment in FIG. 11 directly uses periodic solid sine geometric shape as target.

Figure 12:
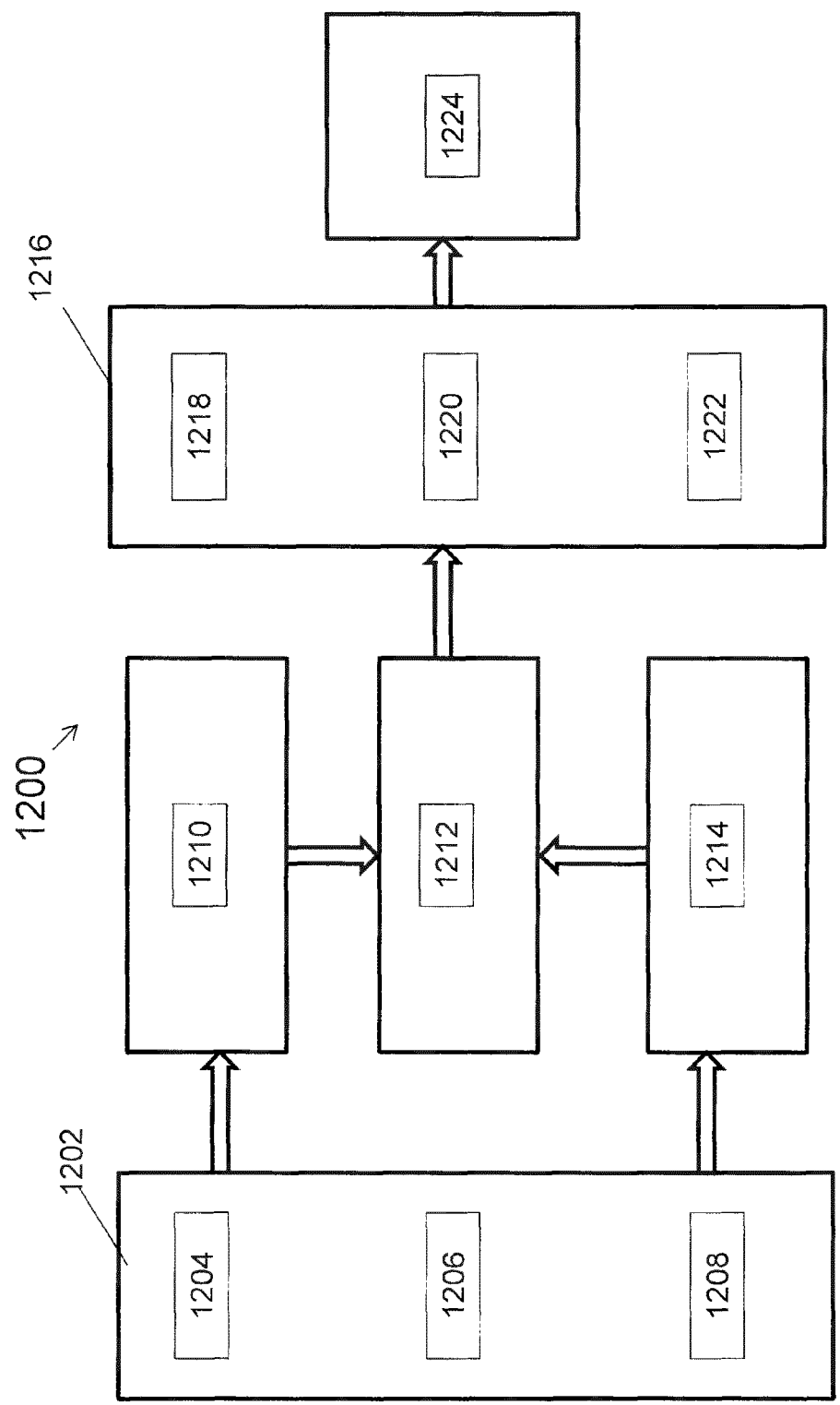

The disclosure may use target with modulated lateral width for overlay and alignment measurement. During target design, various geometric parameters (e.g., pitch and the different lateral widths of the grating lines) can be optimized to achieve good detectability, printability and aberration match. FIG. 12 depicts a flowchart 1200 of a method of designing a metrology target using modulated geometric parameters, according to the present disclosure.

Block 1202 indicates various inputs for designing a target, including lithography process flow parameters (1204), metrology tool settings and target geometry parameters (1206), and lithography model to be used (1208), for example, focus-exposure model. The curvilinear geometric structural parameters may be input in block 1206.

Block 1210 simulates metrology tool detectability key performance indices (KPI) at nominal conditions. Block 1214 simulates lithographic printability KPIs at nominal conditions.

Persons skilled in the art would appreciate that additional steps can be added in the process flow, and/or some steps shown in the flowchart can be substituted by steps specific to a certain lithography process without departing from the scope of the disclosure. Block 1212 filters out targets with poor detectability and printability. Block 1216 indicates simulation of measurement robustness. Specifically, block 1218 simulates detectability robustness KPIs, block 1220 simulates overlay robustness KPIs, and block 1222 simulates aberration sensitivity KPIs.

Finally, in block 1224, the metrology targets that have the appropriate KPIs (or weighted KPIs) are selected for actual measurement.

The two layers each include a target structure and the target structure on at least one of the layers is a target structure disclosed here, they can be used to measure overlay between the layers of an electronic device. The method of measuring overlay includes: measuring diffraction orders from the target structures; determining an overlay error from the diffraction orders.

The target structure disclosed herein can also be used for aligning to an existing structure on a substrate when substrate includes the target structure on it. The method of alignment includes measuring diffraction orders from the target structure and determining an alignment error from the diffraction orders.

The target structure may be represented by electronic data stored on a computer-readable non-transitory medium.

According to an embodiment, a method of measuring alignment or overlay using a target structure on a substrate includes: measuring diffraction orders of diffraction in a first direction from the target structure, wherein the target structure is configured to enhance a first order of the diffraction in the first direction at the expense of an order of the diffraction higher than the first order; wherein diffraction from the target structure in a second direction has only a zero-th order, the first direction and the second direction being different and parallel to the substrate; determining an alignment error or an overlay error from the diffraction orders of diffraction in the first direction. The diffraction orders of diffraction in the first direction higher than the first order may not be enhanced by the target structure.

The invention may further be described using the following clauses:

1. A target structure,
wherein the target structure is configured to be measured with a metrology tool, the metrology tool having a diffraction threshold;
the target structure comprising:
one or more patterns supported on a substrate,
the one or more patterns being periodic with a first period in a first direction and periodic with a second period in a second direction, the first direction and second direction being different and parallel to the substrate,
the first period being equal to or greater than the diffraction threshold and the second period is less than the diffraction threshold
wherein the one or more patterns are configured to enhance a first order of diffraction from the target structure in the first direction at the expense of an order of the diffraction higher than the first order.

2. The target structure of clause 1, wherein the one or more patterns are configured such that diffraction from the target structure in the second direction has only a zero-th order.

3. The target structure of any one of clauses 1 to 2, wherein the one or more patterns are configured such that the metrology tool is able to measure alignment or overlay from the one or more patterns.

4. The target structure of any one of clauses 1 to 3, wherein the one or more patterns are formed with a photoresist.

5. The target structure of any one of clauses 1 to 4, wherein the one or more patterns are etched into the substrate.

6. The target structure of any one of clauses 1 to 5, wherein the one or more patterns have a different height in a direction perpendicular to the substrate than objects surrounding the patterns.

7. The target structure of any one of clauses 1 to 6, wherein the one or more patterns have a different optical property than objects surrounding the patterns.

8. The target structure of any one of clauses 1 to 7, wherein the first direction is perpendicular to the second direction.

9. The target structure of any one of clauses 1 to 8, wherein the first period is a period of a dimension of the one or more patterns in a direction other than the first direction.

10. The target structure of any one of clauses 1 to 9, wherein a dimension of the one or more patterns in a direction other than the first direction is a sine function of a location of the one or more patterns in the first direction.

11. The target structure of any one of clauses 1 to 10, wherein the one or more patterns comprise lines in the second direction.

12. The target structure of clause 11, wherein the lines have an equal size in the first direction.

13. The target structure of clause 11, wherein each of the lines has a uniform size in the first direction.

14. A substrate, comprising the target structure of any one of clauses 1 to 13 and patterns representing a structure of an electronic device.

15. A method of fabricating the target structure of any one of clauses 1 to 13, the method comprising: fabricating a plurality of parallel lines on the substrate; forming the one or more patterns by changing a length of the lines.

16. The method of clause 15, wherein fabricating the lines comprises exposure with a first patterning device and forming the patterns comprises exposure with a second patterning device.

17. A computer implemented method of measuring overlay between structures on two different layers of an electronic device, where each of the two layers comprises a target structure and at least one of the target structures on the two layers is the target structure of any one of clauses 1 to 13, the method comprising: measuring diffraction orders from the target structures; determining an overlay error from the diffraction orders.

18. A computer implemented method of aligning to an existing structure on a substrate, wherein the substrate comprises the target structure of any one of clauses 1 to 13, the method comprising: measuring diffraction orders from the target structure; determining an alignment error from the diffraction orders.

19. A computer-readable non-transitory medium, having electronic data stored thereon, wherein the electronic data represent the target structure of any one of clauses 1 to 13.

20. A method of measuring alignment or overlay using a target structure on a substrate, the method comprising: measuring diffraction orders of diffraction in a first direction from the target structure, wherein the target structure is configured to enhance a first order of the diffraction in the first direction at the expense of an order of the diffraction higher than the first order; wherein diffraction from the target structure in a second direction has only a zero-th order, the first direction and the second direction being different and parallel to the substrate; determining an alignment error or an overlay error from the diffraction orders of diffraction in the first direction.

21. The method of clause 20, wherein diffraction orders of diffraction in the first direction higher than the first order are not enhanced by the target structure.

22. The method of any one of clauses 20 to 21, wherein the first direction is perpendicular to the second direction.

23. The method of any one of clauses 20 to 21, wherein the target structure comprises one or more patterns, the one or more patterns being periodic with a first period in the first direction and periodic with a second period in the second direction.

24. The method of clause 23, wherein the first period is a period of a dimension of the one or more patterns in a direction other than the first direction.

25. The method of any one of clauses 20 to 24, wherein the target structure is formed with a photoresist.

26. The method of any one of clauses 20 to 24, wherein the target structure is etched into the substrate.

27. The method of any one of clauses 20 to 26, wherein the target structure comprises lines in the second direction.

28. The method of clause 27, wherein the lines have an equal size in the first direction.

29. The method of clause 27, wherein each of the lines has a uniform size in the first direction.

30. A computer-readable non-transitory medium having instructions thereon, the instructions when executed by a computer implementing the method of any one of clauses 20 to 29.

The descriptions above are intended to be illustrative, not limiting. Thus, it will be apparent to one skilled in the art that modifications may be made to the embodiments as described without departing from the scope of the claims set out below.

We claim:

1. A target structure, wherein the target structure is configured to be measured with a metrology tool that has a diffraction threshold, the target structure comprising:
   one or more patterns supported on a substrate, the one or more patterns being periodic with a first period in a first direction and periodic with a second period in a second direction, the first direction and second direction being different and parallel to the substrate,
   wherein the first period is equal to or greater than the diffraction threshold and the second period is less than the diffraction threshold such that radiation from the target has fewer one or more orders of radiation in the second direction than one or more orders of radiation in the first direction, and
   wherein the one or more patterns are configured to enhance a first order of the diffraction from the target structure in the first direction at the expense of an order of the diffraction higher than the first order.

2. The target structure of claim 1, wherein the one or more patterns are configured such that diffraction from the target structure in the second direction has only a zero-th order.

3. The target structure of claim 1, wherein the one or more patterns are configured such that the metrology tool is able to measure alignment or overlay from the one or more patterns.

4. The target structure of claim 1, wherein the one or more patterns are formed with a photoresist, and/or wherein the one or more patterns are etched into the substrate.

5. The target structure of claim 1, wherein the one or more patterns have a different height in a direction perpendicular to the substrate than one or more objects surrounding the one or more patterns.

6. The target structure of claim 1, wherein the one or more patterns have a different optical property than one or more objects surrounding the one or more patterns.

7. The target structure of claim 1, wherein the first direction is perpendicular to the second direction.

8. The target structure of claim 1, wherein the first period is a period of a dimension of the one or more patterns in a direction other than the first direction.

9. The target structure of claim 1, wherein a dimension of the one or more patterns in a direction other than the first direction is a sine function of a location of the one or more patterns in the first direction.

10. The target structure of claim 1, wherein the one or more patterns comprise lines in the second direction.

11. The target structure of claim 10, wherein the lines have an equal size in the first direction, or wherein each of the lines has a uniform size in the first direction.

12. A substrate, comprising the target structure of claim 1, and one or more patterns representing a structure of an electronic device.

13. A method of measuring overlay between structures of two different layers of an electronic device, where each of the two layers comprises a target structure and at least one of the target structures of the two layers is the target structure of claim 1, the method comprising:
   measuring diffraction orders from the target structures; and
   determining an overlay error from the diffraction orders.

14. A method of aligning to an existing structure on a substrate, wherein the substrate comprises the target structure of claim 1, the method comprising:
  measuring diffraction orders from the target structure; and
  determining an alignment error from the diffraction orders.

15. A method of measuring alignment or overlay using a target structure on a substrate, the method comprising:
  measuring orders of diffraction in a first direction from the target structure,
  wherein the target structure is configured to enhance a first order of the diffraction in the first direction at the expense of an order of the diffraction higher than the first order, and
  wherein diffraction from the target structure in a second direction has only a zero-th order such that radiation from the target has fewer one or more orders of radiation in the second direction than the orders in the first direction, the first direction and the second direction being different and parallel to the substrate; and
  determining an alignment error or an overlay error from the orders of the diffraction in the first direction.

16. The method of claim 15, wherein orders of the diffraction in the first direction higher than the first order are not enhanced by the target structure.

17. The method of claim 15, wherein the first direction is perpendicular to the second direction.

18. The method of claim 15, wherein the target structure comprises one or more patterns, the one or more patterns being periodic with a first period in the first direction and periodic with a second period in the second direction.

19. The method of claim 18, wherein the first period is a period of a dimension of the one or more patterns in a direction other than the first direction.

20. The method of claim 15, wherein the target structure comprises lines in the second direction, wherein the lines have an equal size in the first direction and/or each of the lines has a uniform size in the first direction.

* * * * *